United States Patent
Guyaux et al.

(10) Patent No.: US 8,858,714 B2
(45) Date of Patent: Oct. 14, 2014

(54) INJECTOR FOR A VACUUM EVAPORATION SOURCE

(75) Inventors: Jean-Louis Guyaux, Chilly Mazarin (FR); Franck Stemmelen, Vaureal (FR); Olivier Grange, Saint-Cloud (FR)

(73) Assignee: Riber, Bezons (FR)

( * ) Notice: Subject to any disclaimer, the term of this patent is extended or adjusted under 35 U.S.C. 154(b) by 953 days.

(21) Appl. No.: 12/985,524

(22) Filed: Jan. 6, 2011

(65) Prior Publication Data
US 2012/0160171 A1 Jun. 28, 2012

(30) Foreign Application Priority Data

Dec. 27, 2010 (EP) .................................... 10306524

(51) Int. Cl.
  *C23C 16/00* (2006.01)
  *C23C 14/26* (2006.01)
  *C23C 14/24* (2006.01)

(52) U.S. Cl.
  CPC .............. *C23C 14/26* (2013.01); *C23C 14/243* (2013.01)
  USPC .......................................... 118/726; 118/727

(58) Field of Classification Search
  USPC .................................................. 118/726, 727
  See application file for complete search history.

(56) References Cited

U.S. PATENT DOCUMENTS

| 3,949,938 | A * | 4/1976 | Goodinge .................. 239/102.2 |
| 5,421,522 | A * | 6/1995 | Bowen ......................... 239/600 |
| 2004/0035366 | A1* | 2/2004 | Keum et al. ................... 118/726 |
| 2009/0199873 | A1* | 8/2009 | Pruett ........................ 134/22.12 |
| 2010/0031878 | A1 | 2/2010 | Priddy et al. |
| 2010/0043710 | A1* | 2/2010 | Min et al. ...................... 118/726 |
| 2010/0159132 | A1* | 6/2010 | Conroy et al. ............. 427/248.1 |
| 2010/0248416 | A1 | 9/2010 | Priddy et al. |

FOREIGN PATENT DOCUMENTS

WO  2008/079209 A1  7/2008

OTHER PUBLICATIONS

European Search Report, dated May 4, 2011, in EP 10 30 6522.
European Search Report, dated May 4, 2011, in EP 10 30 6524.

* cited by examiner

*Primary Examiner* — Keath Chen
(74) *Attorney, Agent, or Firm* — Young & Thompson

(57) ABSTRACT

An injector for a vacuum evaporation source includes an injection duct (1) having a longitudinal axis (11) and an inlet port (2) able to be connected to a vacuum evaporation source, and at least one nozzle (3) for diffusing a vaporized material, the nozzle (3) having a lateral face (4), and an upper face (5). The nozzle (3) includes a main channel (6) emerging outside the injection duct (1) and at least a lateral feeding channel (7) connecting the interior of the injection duct (1) to the main channel (6). The lateral feeding channel (7) has a lateral orifice (8) emerging inside the injection duct (1) through the lateral face (4) of the nozzle (3) for avoiding the clogging of the nozzle (3) by oxidized materials.

12 Claims, 3 Drawing Sheets

Section A-A

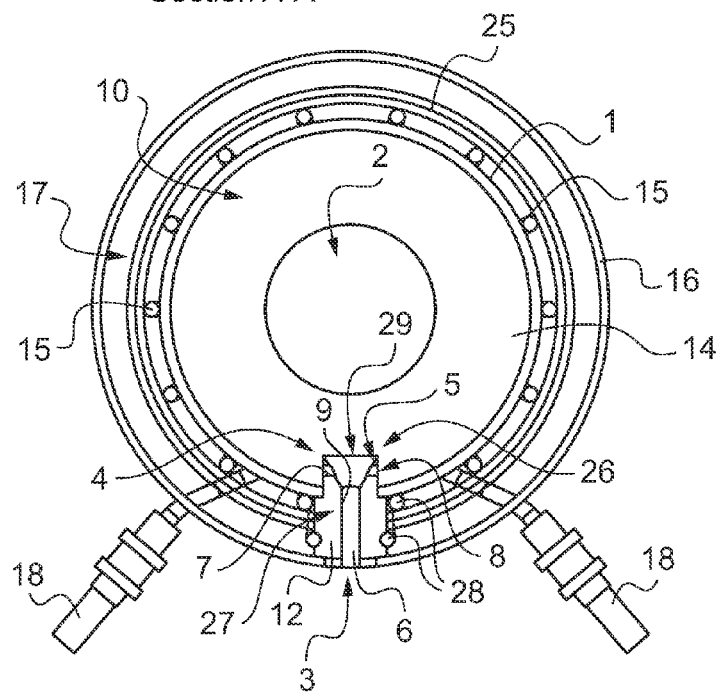
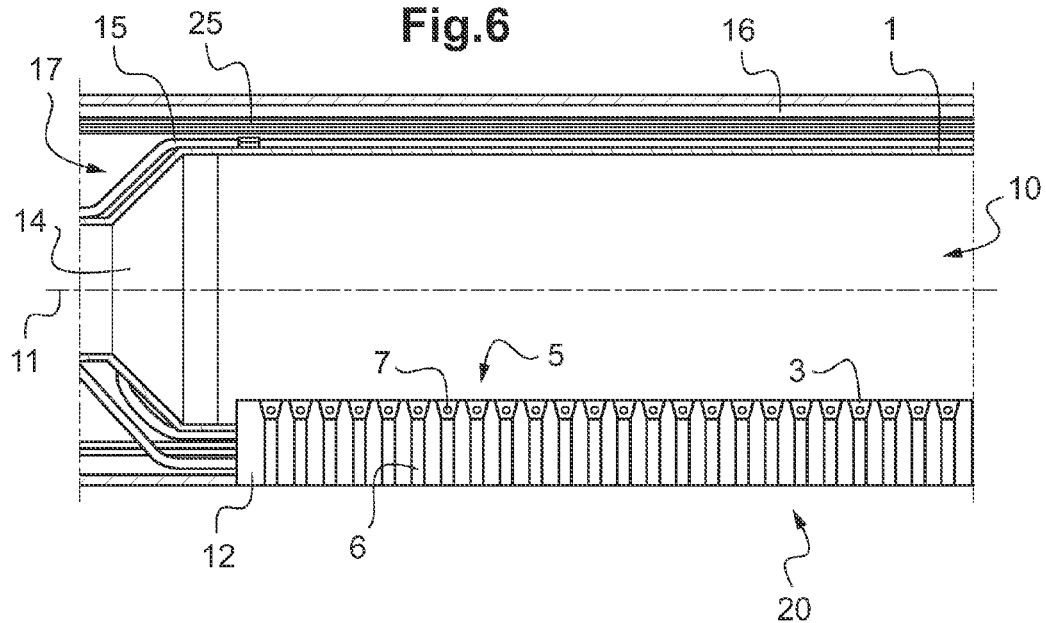

INJECTOR FOR A VACUUM EVAPORATION SOURCE

BACKGROUND OF THE INVENTION

1. Field of the Invention
2. Description of the Related Art

The present invention relates to an injector for a vacuum evaporation source intended to evaporate or sublime materials in a vacuum deposition chamber.

Such a vacuum deposition chamber is used for the manufacture of CIGS (Copper Indium Gallium Selenium) solar cells or OLED (organic light-emitting device) diodes, for instance.

This vacuum evaporation source is particularly used to evaporate selenium for glass panel selenisation in horizontal top-down or bottom-up in line systems.

The document WO 2008/079209 discloses a known vacuum evaporation source intended to evaporate organic or inorganic materials for the fabrication of OLED diodes.

Such a vacuum evaporation source comprises a body attachable to a vacuum deposition system. The body comprises first and second body portions separable from each other. A valve is connected to an injector having a longitudinal shape and several exit orifices for diffusing the vaporized material. The injector is heated by heating means located on its external surface.

When the injector is used in horizontal bottom-up configuration, the nozzles are positioned in the bottom of the injector.

Each nozzle comprises a channel linking the interior and the exterior of the injector. The channel emerges inside the injector through the top face of the nozzle.

During the deposition process, a part of the vaporized materials is adsorbed and oxidized on the internal walls of the injector. Because of the variations of temperature, the oxidized materials become cracked. Some flakes of oxidized materials become detached from the wall of the injector and fall on the top face of the nozzles, leading to the clogging of a part of the nozzles.

The clogging of the nozzles leads to a non uniform spraying of the vaporized materials on the panels intended to be covered by the material.

BRIEF SUMMARY OF THE INVENTION

One object of the present invention is to provide an injector enabling to avoid the clogging of the nozzles by the oxidized materials.

To this end, the injector comprises:
an injection duct having a longitudinal axis and comprising an inlet port able to be connected to a vacuum evaporation source, and at least one nozzle for diffusing a vaporized material, said nozzle having a lateral face, and an upper face.

According to the invention, the nozzle comprises:
a main channel emerging outside said injection duct and at least a lateral feeding channel connecting the interior of the injection duct to the main channel, said lateral feeding channel having a lateral orifice emerging inside said injection duct through the lateral face of said nozzle for avoiding the clogging of said nozzle by oxidized materials.

The invention provides an injector avoiding the clogging of the nozzles by the oxidized materials.

If the top opening of a main channel of a nozzle is covered by a flake of oxidized materials, the vaporized material can be sprayed through the lateral feeding channel.

It permits to ensure a uniform spraying of the vaporized material on the surface of a solar cell panel in a horizontal bottom-up in line vacuum process chamber, no matter the presence of flakes of oxidized materials.

The delay between two processes for cleaning the injector is increased, leading to a lower cost.

The injector being disconnected from the vacuum process chamber for cleaning this one, the deposition process is interrupted less often, leading to increase the productivity.

According to various embodiments, the present invention also concerns the characteristics below, considered individually or in all their technical possible combinations:

lateral orifice of the lateral feeding channel is positioned in the vicinity of the upper face of said nozzle;

It permits to avoid that materials having condensated at the bottom of the injector, flow into the nozzle.

the nozzle comprises two lateral feeding channels which are perpendicular to said main channel, said main channel and said lateral feeding channels being perpendicular to the longitudinal axis;

said main channel comprises an upper portion emerging inside said injection duct through the upper face of said nozzle by an upper opening;

the upper face of said nozzle has a conical or an angular shape.

This geometry enables to avoid the clogging of the upper opening of the main channel of the nozzle by a flake of oxidized materials staying on the upper face of the nozzle.

BRIEF DESCRIPTION OF THE DRAWINGS

The description of the invention is illustrated by the following drawings in which:

FIG. 5 represents a section A-A of the injector according to a second embodiment of the invention; and FIG. 6 represents the detail of the injector according to the second embodiment in the longitudinal section.

DETAILED DESCRIPTION OF THE PREFERRED EMBODIMENTS

Figure 1:
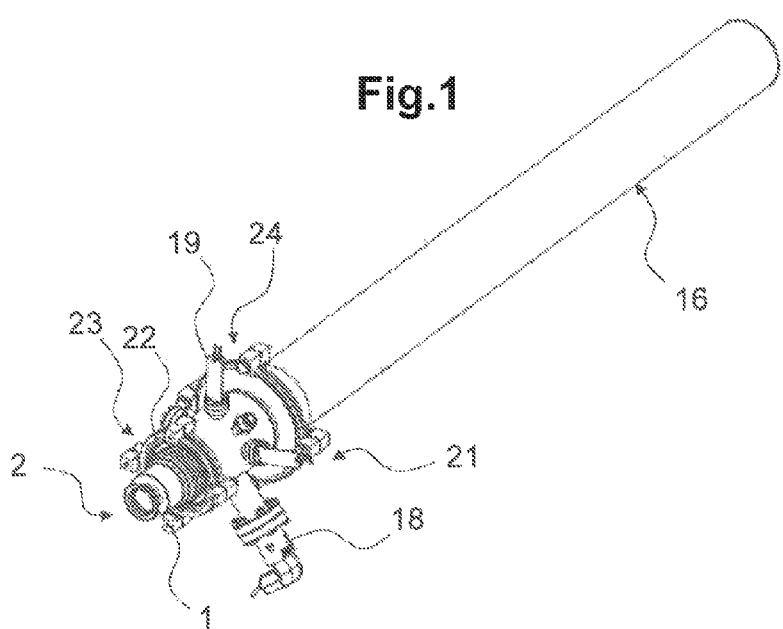
FIG. 1 represents a three dimensional view of an injector, according to an embodiment of the invention.
Figure 2:
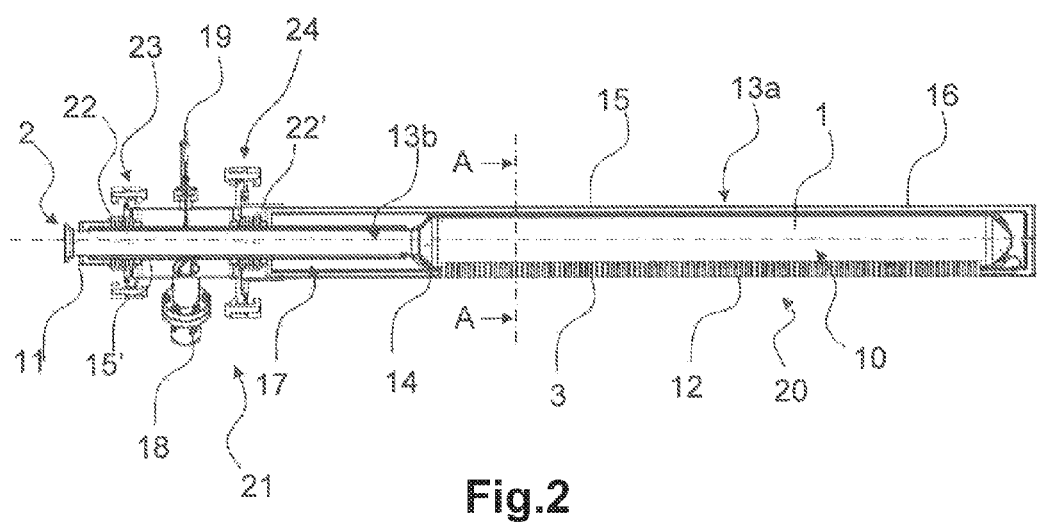
FIG. 2 represents this injector according to a longitudinal section.

As illustrated in FIGS. 1 and 2, the injector comprises an injection duct 1 delimiting a first vacuum volume 10. The injection duct 1 extends longitudinally and has a tubular shape with a circular section.

The injection duct 1 comprises an inlet port 2 able to be connected to a vacuum evaporation source, and at least one nozzle 3 for diffusing the vaporized materials into a vacuum deposition chamber (not represented).

Figure 4:
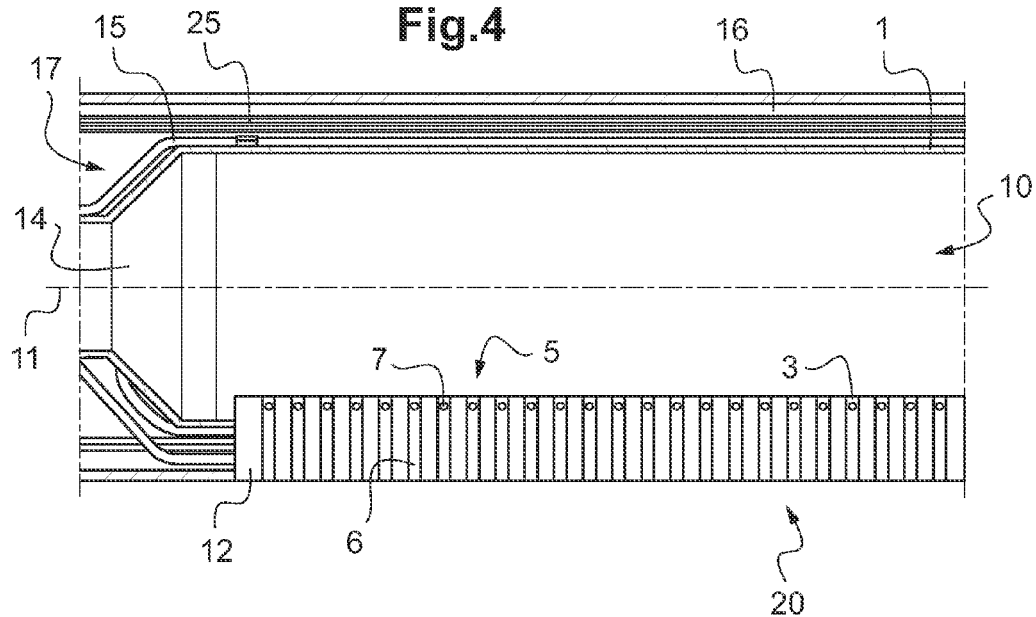
FIG. 4 represents the detail of the injector according to the longitudinal section.

In the example of FIG. 4, the injection duct 1 comprises several nozzles 3 which are equidistant and aligned according to a longitudinal axis 11.

Preferably, the nozzles 3 are embedded in a linear nozzle assembly 12 forming a block wherein the nozzles 3 are born.

Each nozzle 3 comprises a main channel 6 emerging outside the injection duct 1 and at least a lateral feeding channel 7 connecting the injection duct 1 to the main channel 6.

The lateral feeding channel 7 has a lateral orifice 8 emerging inside the first vacuum volume 10 of the injection duct 1 and through the lateral face 4 of the nozzle 3. This lateral positioning of orifice 8 is meant for avoiding the clogging of the nozzle 3 by oxidized materials.

Preferably, the main channel 6 and the lateral feeding channel 7 have a circular section. The section can be different like ovoid.

The diameters of the main channel 6 and the lateral feeding channel 7 can be identical or different.

Preferably, the diameter of the main channel 6 is greater than the diameter of the lateral feeding channel 7.

The diameter of each main channel 6 can be different.

The lateral feeding channel 7 is positioned upstream from the main channel 6.

The material in a vapour phase in the first vacuum volume 10 of the injector passes through the lateral feeding channel 7 and then the main channel 6 in order to be sprayed into a vacuum process chamber.

In the example of FIGS. 1 to 4, each nozzle 3 comprises two lateral feeding channels 7 positioned in opposition with respect to the main channel 6 and perpendicularly to this one and to the longitudinal axis 11. The main channel 6 is perpendicular to the longitudinal axis 11.

Other configurations are possible. The main channel 6 can be inclined with respect to the longitudinal axis 11, for instance. All the main channels 6 can be aligned or not.

Alternatively, the lateral feeding channels 7 can be oriented in a direction different from perpendicular to the main channel 6.

The lateral feeding channel 7 and the main channel 6 can be aligned in order to form a unique channel which is inclined with respect to the longitudinal axis 11.

Alternatively, each nozzle 3 can comprise more than two lateral feeding channels 7.

Preferably, the lateral orifice 8 of the lateral feeding channel 7 is positioned in the vicinity of the upper face 5 of the nozzle 3.

In a possible embodiment, the main channel 6 comprises an upper portion 9 having an upper opening 29 emerging inside the injection duct 11 and through the upper face 5 of the nozzle 3.

Alternatively, the main channel 6 does not emerge in the injector.

In a possible embodiment, as illustrated in FIGS. 5-6, the upper face 5 of the nozzle 3 has a conical shape or is inclined.

The upper face 5 of the nozzle 3 can comprise two inclined planes joined to form an angle.

The injection duct 1 comprises a first part 13*a* having a larger diameter and a second part 13*b* having a smaller diameter.

The nozzle assembly 12 is located in the first part 13*a*.

The first part 13*a* and the second part 13*b* of the injection duct 1 are linked by a conical portion 14.

The injector 1 comprises heating device 15, 15' surrounding the wall of the injection duct 1.

The injector 1 comprises an additional wall 16 surrounding at least partially the injection duct 1. The additional wall 16 and the injection duct 1 delimiting a second vacuum volume 17 which is distinct and hermetically isolated from the first vacuum volume 10 and the exterior of the injector 1.

The heating device 15, 15' is positioned inside the second vacuum volume 17, avoiding the contact between the heating device 15, 15' and the vaporized materials. The pressure in the second vacuum volume 17 is comprised between $10^{-2}$ Torr and $10^{-4}$ Torr, and is preferably of $10^{-3}$ Torr.

The pressure in the first vacuum volume 10 can reach $10^{-6}$ Torr. The heating device 15, 15' is feed by connectors 18. The injector 1 comprises a temperature sensor 19 for controlling the temperature of the heating device 15, 15'. The additional wall 16 forms an additional casing wherein the injection duct 1 is embedded. The additional casing has a tubular shape.

The additional wall 16 can comprise an opening 20 in front of the nozzle assembly 12. The nozzles 3 emerge through the additional wall 16.

Figure 3:
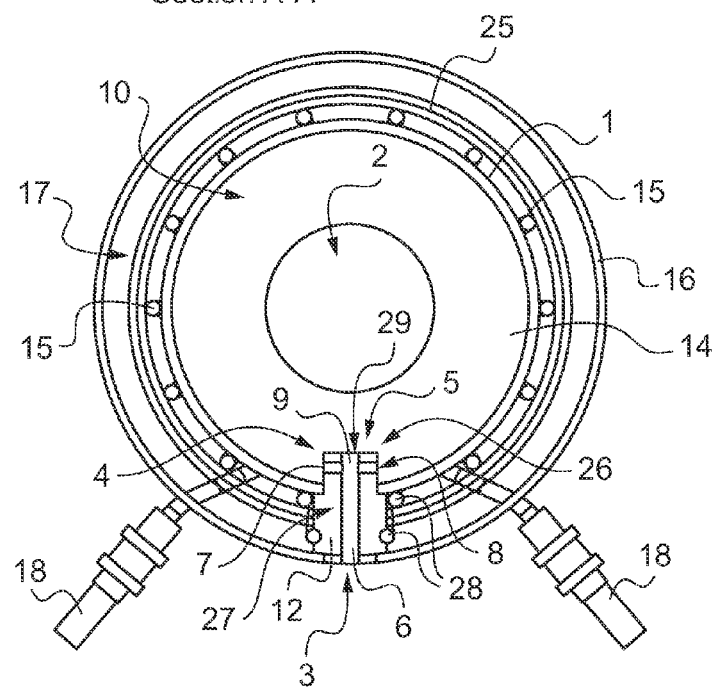
FIG. 3 represents the injector according to a section A-A.

Each nozzle 3 comprises an upper part 26 protruding above the internal surface of the injection duct 1 and a lower part 27 protruding above the external surface of the injection duct 1, as illustrated in FIG. 3. The lower part 27 is located between the injection duct 1 and the additional wall 16 and is surrounded by heating elements 28 like cartridges.

The upper part 26 of the nozzle 3 is positioned in the first vacuum volume 10 of the injection duct 1 and comprises the two lateral feeding channels 7.

The main channel 6 crosses vertically and completely the nozzle 3. The main channel 6 emerges outside the injector through the additional wall 16.

The additional wall 16 extends up to the vicinity of the inlet port 2 of the injection duct 1.

The additional wall 16 comprises an intermediate portion 21 positioned between the inlet port 2 and the nozzles 3 of the injector 1.

The intermediate portion 21 comprises at least one bellow 22, 22' surrounding the injection duct 1. The bellow is able to extend in order to counterbalance the longitudinal dilatation of the injection duct 1 when this one is heated.

The injection duct 1 is heated at a temperature comprised between 450° C. and 550° C. for instance.

Preferably, the intermediate portion 21 comprises two bellows 22, 22' which are metallic.

The intermediate portion 21 surrounds partially the second part 13*b* of the injection duct 1. The intermediate portion 21 is positioned near the inlet port 2 of the injection duct 1.

The heating device 15, 15' comprises first heating means 15 surrounding at least the first part 13*a* of the injection duct 1 up to the intermediate portion 21.

The first heating means 15 are disposed along the additional wall 16 and can comprise several cartridges disposed longitudinally.

The heating device 15, 15' comprises second heating means 15' surrounding the second part 13*b* of the injection duct 1.

The second heating means 15' extend from the inlet port 2 of the injection duct 1 up to the conical portion 14.

The intermediate portion 21 comprises a first flange 23 for connecting the intermediate portion 21 to a vacuum evaporation source, and a second flange 24 for connecting the intermediate portion 21 to a vacuum deposition chamber. The first flange 23 and the second flange 24 are disposed in opposition. Each flange comprises a plate integral with the wall of the intermediate portion 21.

The first and second bellows 22, 22' can extend and compress longitudinally along the injection duct 1 according to the length of the injection duct 1 varying in function of the temperature.

The injector can comprise an isolating element 25 covering the heating device 15, 15'

The injector is used to spray materials having a vapor pressure superior to $10^{-3}$ Torr when heated at a temperature comprised between 300° C. to 500° C.

Preferably, the material is selenium or phosphor for instance.

For example, the part of the injector placed inside of the deposition chamber has a length of 2200 to 2600 mm, the total length of the injector can be 3000 to 3500 mm, a diameter of 100 to 130 mm, and at least 100 nozzles distributed along a length of 500 to 1800 mm.

The invention claimed is:

1. Injector for a vacuum evaporation source comprising:
   an injection duct (1) having a longitudinal axis (11) and comprising an inlet port (2) to be connected to a vacuum evaporation source, and at least one nozzle (3) for diffusing a vaporized material, said nozzle (3) having a lateral face (4), and an upper face (5) with an upper opening (29),
   wherein said nozzle (3) comprises a main channel (6) emerging outside said injection duct (1) and at least one lateral feeding channel (7) connecting the interior of the injection duct (1) to the main channel (6), said lateral feeding channel (7) having a lateral orifice (8) emerging inside said injection duct (1) through the lateral face (4) of said nozzle (3) thereby avoiding clogging of the upper opening (29) of the main channel of the nozzle by oxidized materials staying on the upper opening (29) of the upper face of the nozzle.

2. Injector for a vacuum evaporation source according to claim 1, characterized in that said lateral orifice (8) of the lateral feeding channel (7) is positioned upstream from the main channel (6).

3. Injector for a vacuum evaporation source according to claim 2, characterized in that said nozzle (3) comprises two lateral feeding channels (7) which are perpendicular to said main channel (6), said main channel (6) and said lateral feeding channels (7) being perpendicular to the longitudinal axis (11).

4. Injector for a vacuum evaporation source according to claim 2, characterized in that said main channel (6) comprises an upper portion (9) having an upper opening (29) emerging inside said injection duct (11) through the upper face (5) of said nozzle (3).

5. Injector for a vacuum evaporation source according to claim 2, characterized in that the upper face (5) of said nozzle (3) has a conical or an angular shape.

6. Injector for a vacuum evaporation source according to claim 1, characterized in that said nozzle (3) comprises two lateral feeding channels (7) which are perpendicular to said main channel (6), said main channel (6) and said lateral feeding channels (7) being perpendicular to the longitudinal axis (11).

7. Injector for a vacuum evaporation source according to claim 6, characterized in that said main channel (6) comprises an upper portion (9) having an upper opening (29) emerging inside said injection duct (11) through the upper face (5) of said nozzle (3).

8. Injector for a vacuum evaporation source according to claim 6, characterized in that the upper face (5) of said nozzle (3) has a conical or an angular shape.

9. Injector for a vacuum evaporation source according to claim 1, characterized in that said main channel (6) comprises an upper portion (9) having the upper opening (29) emerging inside said injection duct (1) through the upper face (5) of said nozzle (3).

10. Injector for a vacuum evaporation source according to claim 9, characterized in that the upper face (5) of said nozzle (3) has a conical or an angular shape.

11. Injector for a vacuum evaporation source according to claim 1, characterized in that the upper face (5) of said nozzle (3) has a conical or an angular shape.

12. An injector for a vacuum evaporation source, comprising:
   an injection duct (1) having a longitudinal axis (11) and comprising an inlet port (2) connectable to a vacuum evaporation source, and a nozzle (3) that diffuses a vaporized material,
   wherein said nozzle (3) has a lateral face (4) and an upper face (5),
   wherein said nozzle (3) comprises i) a main channel (6) emerging outside said injection duct (1) and ii) a lateral feeding channel (7) connecting an interior of said injection duct (1) to said main channel (6),
   wherein said lateral feeding channel (7) has a lateral orifice (8) emerging inside said injection duct (1) through the lateral face (4) of said nozzle (3), and
   wherein said main channel (6) comprises an upper portion (9) having an upper opening (29) emerging inside said injection duct (1) through the upper face (5) of said nozzle (3).

* * * * *